(12) United States Patent
Fujiwara et al.

(10) Patent No.: US 9,704,742 B2
(45) Date of Patent: Jul. 11, 2017

(54) WIRING FILM AND ACTIVE MATRIX SUBSTRATE USING THE SAME, AND METHOD FOR MANUFACTURING WIRING FILM

(75) Inventors: Kazuyuki Fujiwara, Kumamoto (JP); Kazunori Inoue, Kumamoto (JP); Takahito Yamabe, Kumamoto (JP)

(73) Assignee: Mitsubishi Electric Corporation, Tokyo (JP)

( * ) Notice: Subject to any disclaimer, the term of this patent is extended or adjusted under 35 U.S.C. 154(b) by 735 days.

(21) Appl. No.: 13/604,452

(22) Filed: Sep. 5, 2012

(65) Prior Publication Data

US 2013/0056737 A1 Mar. 7, 2013

(30) Foreign Application Priority Data

Sep. 6, 2011 (JP) ................... 2011-193849

(51) Int. Cl.
*H01L 29/786* (2006.01)
*H01L 21/283* (2006.01)
(Continued)

(52) U.S. Cl.
CPC ...... *H01L 21/76838* (2013.01); *H01L 21/283* (2013.01); *H01L 27/1244* (2013.01); *H01L 29/458* (2013.01); *H01L 29/4908* (2013.01)

(58) Field of Classification Search
CPC ............... H01L 27/1214; H01L 27/124; H01L 27/1255; H01L 29/458; H01L 29/4908;
(Continued)

(56) References Cited

U.S. PATENT DOCUMENTS 5,464,500 A 11/1995 Tsujimura et al.
7,262,085 B2 * 8/2007 Gotoh et al. .................. 438/149
(Continued)

FOREIGN PATENT DOCUMENTS

JP 06-122982 5/1994
JP 07-086230 3/1995
(Continued)

OTHER PUBLICATIONS

Takatoshi Tsujimura et al.; "Molybdenum/aluminum stacked metal taper etching for high-resolution thin-film transistor liquid-crystal display"; American Vacuum Society; J. Vac. Sci. Technol. B 20(5); Sep./Oct. 2002; pp. 1907-1913.
(Continued)

*Primary Examiner* — Natalia Gondarenko
(74) *Attorney, Agent, or Firm* — Studebaker & Brackett PC

(57) ABSTRACT

An Al wiring film having a tapered shape is obtained easily and in a stable manner. An Al wiring film has a double-layer structure including a first Al alloy layer made of Al or an Al alloy, and a second Al alloy layer laid on the first Al alloy layer and having a composition different from a composition of the first Al alloy layer by containing at least one element of Ni, Pd, and Pt. The second Al alloy layer is etched by an alkaline chemical solution used in a developing process of a photoresist, and an end portion of the second Al alloy layer recedes from an end portion of the photoresist. Thereafter, by performing wet etching using the photoresist as a mask, a cross section of the Al wiring film becomes a tapered shape.

4 Claims, 6 Drawing Sheets

(51) Int. Cl.
*H01L 21/768* (2006.01)
*H01L 29/45* (2006.01)
*H01L 29/49* (2006.01)
*H01L 27/12* (2006.01)

(58) Field of Classification Search
CPC ...... H01L 23/53223; H01L 29/786–29/78696;
H01L 29/66742–29/6678; H01L
29/66606; H01L 29/66515; H01L
29/41725–29/41791; H01L
29/42384–29/42392; H01L 2924/13067;
H01L 27/3265; H01L 27/3248
USPC ....... 257/59, E29.273, 72, 57, E33.004, 765,
257/347
See application file for complete search history.

(56) References Cited

U.S. PATENT DOCUMENTS

2005/0224795 A1    10/2005  Gotoh et al.
2006/0163741 A1    7/2006   Bae et al.
2009/0183902 A1    7/2009   Kubota et al.
2010/0163877 A1*   7/2010   Hino et al. ...................... 257/59

FOREIGN PATENT DOCUMENTS

| JP | 2001-077098 A  | 3/2001  |
| JP | 2003-127397 A  | 5/2003  |
| JP | 2005-303003 A  | 10/2005 |
| JP | 2006-191013 A  | 7/2006  |
| JP | 2007-157755 A  | 6/2007  |
| JP | 2008-098611 A  | 4/2008  |
| WO | 2008/047667 A1 | 4/2008  |

OTHER PUBLICATIONS

An Office Action; "Notification of Reason(s) for Refusal," issued by the Japanese Patent Office on Jun. 2, 2015, which corresponds to Japanese Patent Application No. 2011-193849 and is related to U.S. Appl. No. 13/604,452; with English language translation.

* cited by examiner

F I G. 1 0
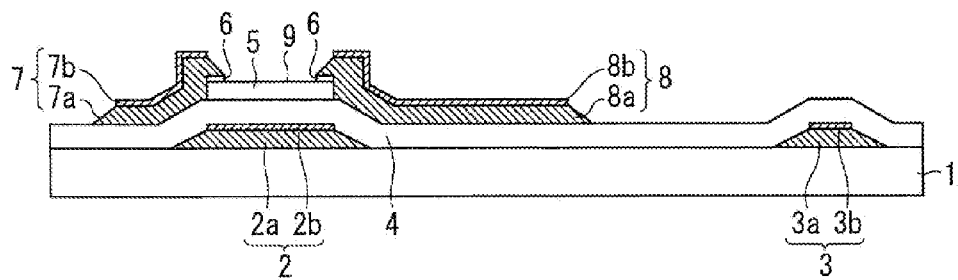
F I G. 1 1
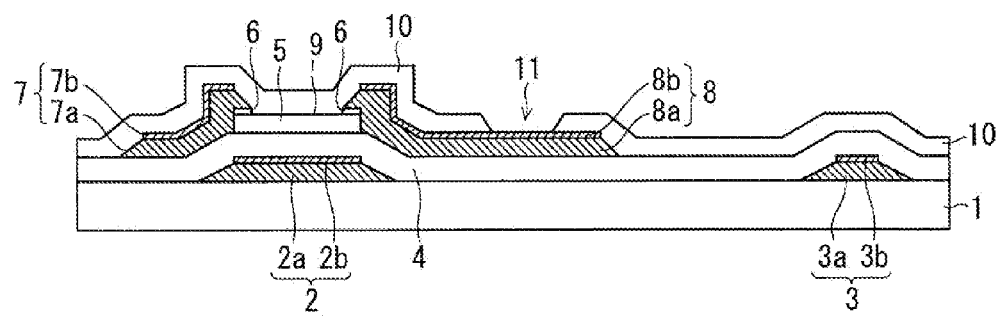
F I G. 1 2
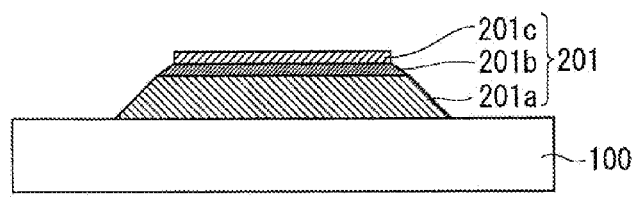

F I G. 1 6
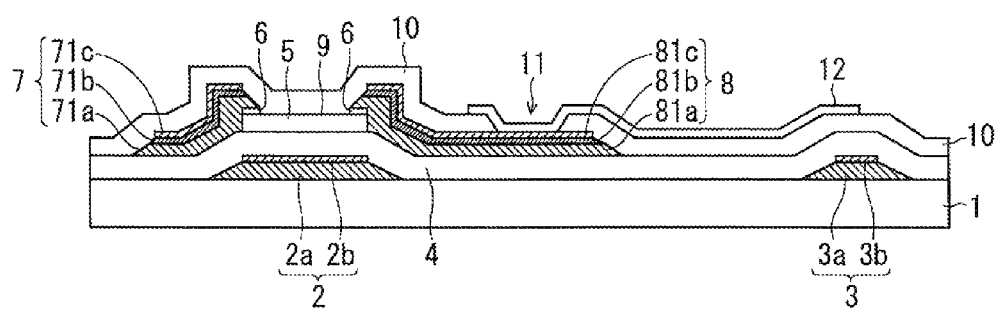

WIRING FILM AND ACTIVE MATRIX SUBSTRATE USING THE SAME, AND METHOD FOR MANUFACTURING WIRING FILM

FIELD OF THE INVENTION

The present invention relates to a structure of a wiring film containing aluminum and a method for manufacturing the same, and more particularly to a wiring film applicable to an electrode of a thin-film transistor provided on an array substrate or the like of a liquid crystal display apparatus.

DESCRIPTION OF THE BACKGROUND ART

For example, aluminum (Al) is known as a material of a wiring film used as an electrode of a thin-film transistor that is formed on an array substrate (active matrix substrate) of a liquid crystal display apparatus. Since an electric resistance of Al is very low, it has been generally used as a wiring material conventionally. In this specification, a film obtained not only from pure Al but also a material containing Al as a main components such as an Al alloy, and a wiring film resulted from patterning such a film are broadly referred to as an "Al film" and an "Al wiring film", respectively.

A wet etching method using a chemical solution containing phosphoric acid and nitric acid series is common as a method of pattern process (patterning). However, since the method is isotropic etching, a sidewall of an Al wiring film resulted from patterning becomes substantially vertical. This causes an insulating film formed on the Al wiring film to have a poor step coverage characteristic, and, as a result, causes broken wiring of a wiring film formed on the insulating film, a reduction of a breakdown voltage of the insulating film, or the like.

A technique for etching the Al film in a tapered shape is proposed to solve such a problem in, for example, Japanese Patent Application Laid-Open Nos. 06-122982, 2001-77098, 2003-127397, and 2007-157755. However, when a composition of a chemical solution (etchant) changes as an etching process progresses or degrades by time in such a technique, an inclination of the sidewall of the tapered Al wiring film acutely changes accordingly. This poses a problem of a difficulty in managing the composition of the etchant.

According to the general wet etching technique for the Al film described above, the sidewall of the Al wiring film subjected to the patterning becomes substantially vertical. This causes the insulating film formed on the Al wiring film to have a poor step coverage characteristic, and, as a result, causes a reduction of a breakdown voltage of the insulating film, broken wiring of the wiring film of an upper layer, or the like, which eventually causes a drop in the yield of the product.

Japanese Patent Application Laid-Open Nos. 06-122982, 2001-77098, 2003-127397, and 2007-157755 propose an etching technique for forming the Al wiring film in a tapered shape. However, it is necessary to severely manage the composition of the etchant to obtain a predetermined tapered shape in a stable manner. To do so, it is necessary, for example, to introduce a facility to constantly monitor the concentration of the etchant, or replace the etchant more frequently, which eventually increases the cost.

Further, when an ordinary Al film is used as an electrode of a thin-film transistor (TFT) of an active matrix substrate for a liquid crystal display apparatus, contact characteristics between the TFT and a pixel electrode are drastically degraded due to an interface reaction with an ITO film which is a transparent pixel electrode. For this reason, it is difficult to apply the Al wiring film as a wiring film on the active matrix substrate.

SUMMARY OF THE INVENTION

It is an object of the present invention to provide a structure of an Al wiring film and a method for manufacturing the same, from which a tapered Al wiring film can be obtained easily and in a stable manner, and which can be applied to an active matrix substrate of a display apparatus.

A wiring film according to a first aspect of the present invention includes a first layer and a second layer laid on the first layer. The first layer is made of Al or an Al alloy. The second layer is made of an Al alloy containing at least one element of Ni, Pd, and Pt and having a composition different from a composition of the first layer. The wiring film has a tapered shape in cross section with a width smaller in an upper portion thereof than a width in a bottom portion thereof.

A wiring film according to a second aspect of the present invention includes a first layer, a second layer laid on the first layer, and a third layer laid on the second layer. The first layer is made of a first Al alloy containing at least one element of Ni, Pd, and Pt. The second layer is made of a second Al alloy containing nitrogen. The third layer is made of a third Al alloy containing at least one element of Ni, Pd, and Pt. The wiring film has a tapered shape in cross section with a width smaller in an upper portion thereof than a width in a bottom portion thereof.

A method for manufacturing a wiring film according to a third aspect of the present invention includes the following steps. A step of forming a first layer made of Al or an Al alloy. A step of forming, on the first layer, a second layer made of an Al alloy containing at least one element of Ni, Pd, and Pt and having a composition different from a composition of the first layer. A step of coating a photoresist on the second layer and performing exposure using a photomask. A step of developing the photoresist after performing the exposure and etching the second layer by using an alkaline chemical solution, so that an end portion of the second layer under the photoresist after the developing recedes from an end portion of the photoresist. A step of forming the wiring film including the first and second layers by etching and patterning the first and second layers simultaneously by wet etching using the photoresist after developing as a mask.

A method for manufacturing a wiring film according to a fourth aspect of the present invention includes the following steps. A step of forming a first layer made of a first Al alloy containing at least one element of Ni, Pd, and Pt. A step of forming, on the first layer, a second layer made of a second Al alloy resulted from adding nitrogen to the first Al alloy. A step of forming, on the second layer, a third layer made of the first Al alloy. A step of coating a photoresist on the third layer and performing exposure using a photomask. A step of developing the photoresist after performing the exposure and etching the third layer by using an alkaline chemical solution, so that an end portion of the third layer under the photoresist after the developing recedes from an end portion of the photoresist. A step of forming the wiring film including the first, second, and third layers by etching and patterning the first, second, and third layers simultaneously by wet etching using the photoresist after developing as a mask.

According to the present invention, the tapered shape of the Al wiring film can be stabilized without a need to manage the etchant stricter than in the conventional case. Accordingly, the step coverage characteristic of the gate insulating film formed on the Al wiring film is improved, it is possible to prevent the breakdown voltage from reducing and the wiring film in the upper layer from breaking, and the yield of the product is improved. In addition, since the second layer made of an Al alloy containing at least one element of Ni, Pd, and Pt can obtain an excellent contact characteristic with an oxide material used as a transparent pixel electrode, it is easy to apply the wiring film to an electrode of a thin-film transistor provided in an active matrix substrate of a display apparatus.

According to the present invention, the tapered shape of the Al wiring film can be stabilized without a need to manage the etchant stricter than in the conventional case. Accordingly, the step coverage characteristic of the insulating film formed on the Al wiring film is improved, it is possible to prevent the breakdown voltage from reducing and the wiring film in the upper layer from breaking, and the yield of the product is improved. In addition, since the layer made of an Al alloy containing at least one element of Ni, Pd, and Pt can obtain an excellent contact characteristic with an oxide material used as a transparent pixel electrode, it is easy to apply the wiring film to an electrode of a thin-film transistor provided in an active matrix substrate of a display apparatus.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 8 to 11 are manufacturing process diagrams of the TFT active matrix substrate according to the first preferred embodiment;

FIG. 12 is a cross sectional view of a structure of an Al wiring film according to a second preferred embodiment;

FIG. 16 is a cross sectional view of a structure of a principal portion of the TFT active matrix substrate according to the second preferred embodiment.

DESCRIPTION OF THE PREFERRED EMBODIMENTS

First Preferred Embodiment

Figure 1:
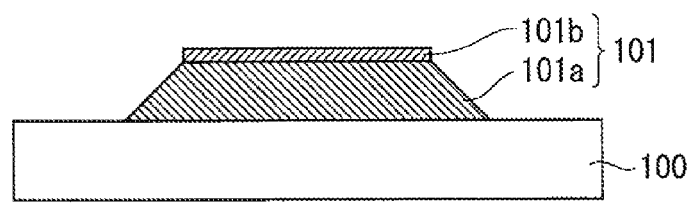
FIG. 1 is a cross sectional view of a structure of an Al wiring film according to a first preferred embodiment.

FIG. 1 is a cross sectional view of a structure of an Al wiring film according to a first preferred embodiment. As illustrated in FIG. 1, an Al wiring film 101 formed on a substrate 100 according to this preferred embodiment has a double-layer structure including a first Al alloy layer 101a and a second Al alloy layer 101b formed thereon, and has a tapered shape in cross section with a width smaller in an upper portion thereof than a width in a bottom portion thereof.

The first Al alloy layer 101a is a layer including Al as a main component. This is not restricted to the Al alloy, but pure Al may also be used. The second Al alloy layer 101b is made of an Al alloy containing at least one element of nickel (Ni), palladium (Pd), and platinum (Pt). The composition of the Al alloy of the first Al alloy layer 101a is different from the composition of the Al alloy of the second Al alloy layer 101b.

In addition, the substrate 100 serving as a base for the Al wiring film 101 may be a semiconductor substrate such as a silicon substrate, an insulating substrate such as a glass substrate used as an active matrix substrate for a display apparatus, or an interlayer dielectric film provided on another wiring layer.

Figure 2:
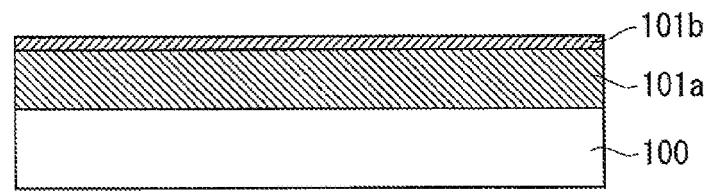
FIGS. 2 to 4 are manufacturing process diagrams of the Al wiring film according to the first preferred embodiment.
Figure 3:
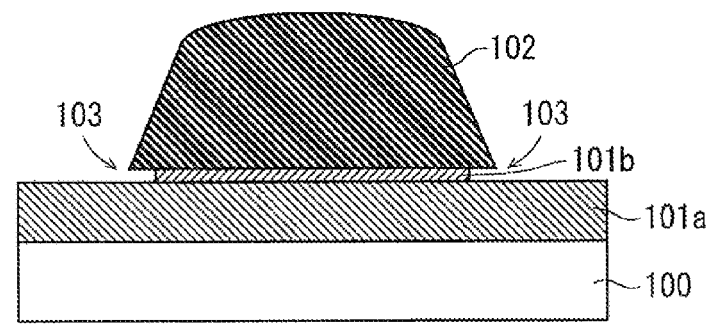
Figure 4:
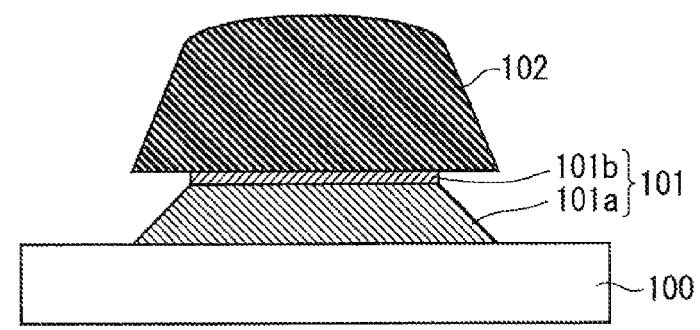

Hereinafter, a method for manufacturing the Al wiring film 101 illustrated in FIG. 1 will be described. FIGS. 2 to 4 are manufacturing process diagrams thereof.

First, the first Al alloy layer 101a made of Al or an Al alloy is formed on the substrate 100. Formed on top of it is the second Al alloy layer 101 made of an Al alloy containing at least one element of Ni, Pd, and Pt and having different composition from that of the first Al alloy layer 101a (FIG. 2). In this preferred embodiment, Al is formed into a film having a thickness of 200 nm as the first Al alloy layer 101a, and the Al alloy resulted from adding 3 mol % Ni to Al is formed into a film having a thickness of 20 nm as the second Al alloy layer 101b by sputtering using an Ar gas.

Thereafter, a photoresist 102 having a predetermined pattern is formed on the second Al alloy layer 101b using a photoengraving technique (FIG. 3). In this preferred embodiment, a positive type photoresist of a novolak resin is coated by a slit coater or a spin coater to a thickness of 1.6 μm and is exposed using a photomask. Subsequently, the resultant is developed using an alkaline chemical solution to form the photoresist 102 having the predetermined pattern. In this preferred embodiment, an organic alkaline developing solution (liquid temperature of 23° C.) containing 2.4 wt % of tetramethylammonium hydroxide (TMAH) is used as the alkaline chemical solution.

Here, since the Al alloy containing at least one element of Ni, Pd, and Pt is etched by the alkaline chemical solution, the second Al alloy layer 101b exposed from the photoresist 102 is etched in a developing process of the photoresist 102. The second Al alloy layer 101b (thickness of 20 nm) containing 3 mol % Ni used in this preferred embodiment is etched by the TMAH organic alkaline developing solution at an etching rate of about 60 nm/min. Therefore, when the developing process is extended by 20 seconds after the photoresist 102 is developed, a portion of the second Al alloy layer 101b exposed from the photoresist 102 is removed.

When the developing process is further extended, the second Al alloy layer 101b under the photoresist 102 is etched in a transverse direction (in-plane direction of the film), and, as illustrated in FIG. 3, a width of the second Al alloy layer 101b becomes smaller than a width of the photoresist 102. This means that ends of the second Al alloy layer 101b individually recede from ends of the photoresist 102.

In contrast, the first Al alloy layer 101a made of Al is hardly etched by the organic alkaline developing solution containing TMAH. As a result, notches 103 having an undercut shape are formed between the photoresist 102 and the first Al alloy layer 101*a* caused by receding of the ends of the second Al alloy layer 101*b*.

Thereafter, in wet etching using the photoresist 102 as a mask, the first Al alloy layer 101*a* and the second Al alloy layer 101*b* are simultaneously subjected to etching and patterning, so that the Al wiring film 101 having the predetermine pattern is formed (FIG. 4). In this preferred embodiment, an etchant of PAN series (phosphoric acid, acetic acid, and nitric acid series) is used for the wet etching.

During this process, since a notch shape is provided under the photoresist 102, the ends of the second Al alloy layer 101*b* and an upper surface of the first Al alloy layer 101*a* are isotropically etched. Specifically, the upper surface of the first Al alloy layer 101*a* is etched while the ends of the second Al alloy layer further recede. As a result, the sidewall of the Al wiring film 101 is inclined, and the Al wiring film 101 has a tapered shape with a width smaller in the upper portion than a width in the bottom portion.

Finally, by removing the photoresist 102, the Al wiring film 101 illustrated in FIG. 1 is completed.

Since the Al wiring film 101 according to this preferred embodiment has a tapered shape, it is possible to have a good step coverage characteristic when an insulating film is formed thereon. Accordingly, this prevents the breakdown voltage of the insulating film from reducing, prevents the wire of the wiring film in the upper layer from breaking, and contributes to improvement of the yield of the product.

Further, since a process of patterning the Al wiring film 101 into a tapered shape can be performed during the isotropically etching of the first Al alloy layer 101*a* and the second Al alloy layer 101*b*, the tapered shape (inclination of the sidewall) of the Al wiring film 101 is hardly affected by the change of the composition of the etchant. Therefore, the Al wiring film 101 having a predetermined tapered shape can be obtained easily and in a stable manner without a need to manage the etchant stricter than in the conventional case. Accordingly, the cost incurred in managing the etchant does not increase.

Although the Al alloy containing 3 mol % Ni is used as the second Al alloy layer 101*b* in this preferred embodiment, the application of the present invention is not restricted to this. An Al alloy film serves as the second Al alloy layer 101*b* if at least one element of Ni, Pd, and Pt is added thereto. Ni, Pd, and Pt are the elements that belong to group 10 of the periodic law. The inventors of the present invention confirmed by experiment an effect in which, by adding an appropriate amount of such an element to Al, the etching rate (etching speed) of an Al alloy with respect to an alkaline chemical solution became faster.

Figure 5:
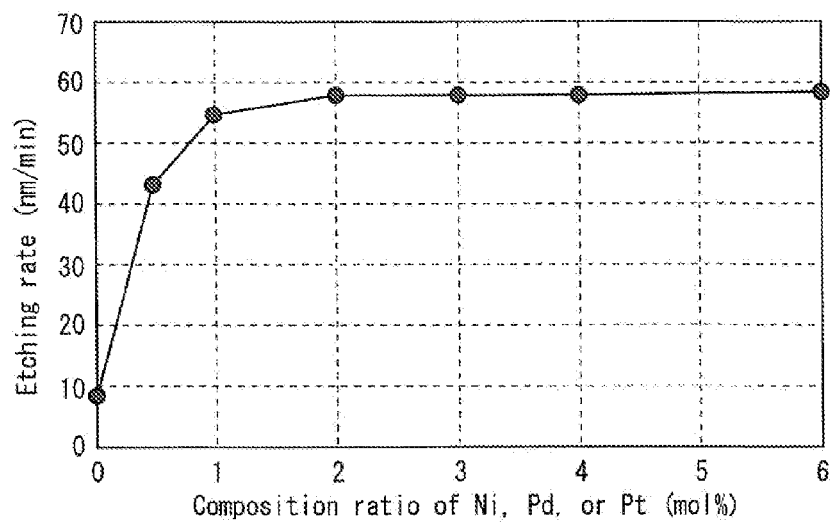
FIG. 5 is a graph indicating a relation between a composition ratio of Ni, Pd, and Pt of an Al alloy and an etching rate with respect to a TMAH organic alkaline chemical solution.

FIG. 5 is a graph indicating a relation between a composition ratio (additive amount) of Ni, Pd, and Pt of an Al alloy in which any of Ni, Pd, and Pt is added to Al and an etching rate with respect to a TMAH organic alkaline chemical solution. The etching rate represents a value when an Al alloy is etched in an organic alkaline developing solution (liquid temperature of 23° C.) containing 2.4 wt % of TMAH.

As indicated in FIG. 5, the composition ratio of Ni, Pd, and Pt of the Al alloy is 0.5 mol %, the etching rate becomes five times faster or more as compared with pure Al (the composition ratio is 0 mol %). Additionally, when the composition ratio of Ni, Pd, and Pt becomes 1 mol % or larger, the etching rate becomes almost saturated.

In a region where the composition ratio of Ni, Pd, and Pt is smaller than 0.5 mol %, the etching rate largely changes, and therefore control of the etching amount becomes difficult. At the same time, since the present invention provides a sufficient effect when the etching rate is five times or more as compared with the case of pure Al, it is preferable that the additive amount of Ni, Pd, and Pt be 0.5 mol % or more. Further, in view of stabilizing the etching rate, it is preferable to set the additive amount to 1 mol % or more.

In contrast, when the additive amount of Ni, Pd, and Pt exceeds 10 mol %, a rate of precipitation of compound phase of AlNi, AlPd, and AlPt increases, and this may be left as an etching residue in the alkaline developing solution and may sometimes cause an etching failure. Accordingly, it is preferable to set the total additive amount of Ni, Pd, and Pt to be added to Al to 10 mol % or smaller.

In addition, although the organic alkaline developing solution having a concentration of TMAH of 2.4 wt % is used as the etchant in this preferred embodiment, it is preferable that the concentration of TMAH be 0.2 wt % or more and 25 wt % or less while the liquid temperature ranges between 10° C. and 50° C. When the concentration of TMAH is less than 0.2 wt %, the etching rate of the Al alloy including Ni, Pd, and Pt is drastically reduced, making the etching difficult to perform. In contrast, when the concentration of TMAH exceeds 25 wt %, damage incurred by the photoresist increases, which causes a concern of pattern defects.

Further, the film thickness of the first Al alloy layer 101*a* is set to 200 nm, and the film thickness of the second Al alloy layer 101*b* formed thereon is set to 20 nm in this preferred embodiment. However, the film thicknesses thereof are not restricted to these examples. The inventors of the present invention confirmed by experiment that as long as the thickness of the second Al alloy layer 101*b* was 40 nm or smaller, the Al wiring film 101 was formed into a substantially smooth tapered shape. When the thickness of the second Al alloy layer 101*b* exceeded 40 nm, the portion of the first Al alloy layer 101*a* and the portion of the second Al alloy layer 101*b* became step-like shapes individually which are shapes independent from each other, and deterioration in the step coverage characteristic when an insulating film 101 was formed on the Al wiring film 101 was observed. Accordingly, when the thickness of the first Al alloy layer 101*a* is 200 nm, it is preferable that the thickness of the second Al alloy layer 101*b* be set to 40 nm or smaller. To state it differently, it is preferable that the thickness of the second Al alloy layer 101*b* be ⅕ or less of that of the first Al alloy layer 101*a*.

Hereinafter, an example of applying the Al wiring film 101 illustrated in FIG. 1 to a TFT active matrix substrate of a liquid crystal display apparatus will be described as a specific example of application. In general, a TFT active matrix substrate has a structure in which a pixel electrode which is a transparent electrode and a thin-film transistor (TFT) which is a switching element for supplying an image signal to the pixel electrode are provided on a transparent insulating substrate for each of a plurality of pixels that are arranged in a matrix pattern, and a source line SL for feeding the image signal to each TFT and a gate line GL for feeding a drive signal to each TFT are further provided.

Figure 6:
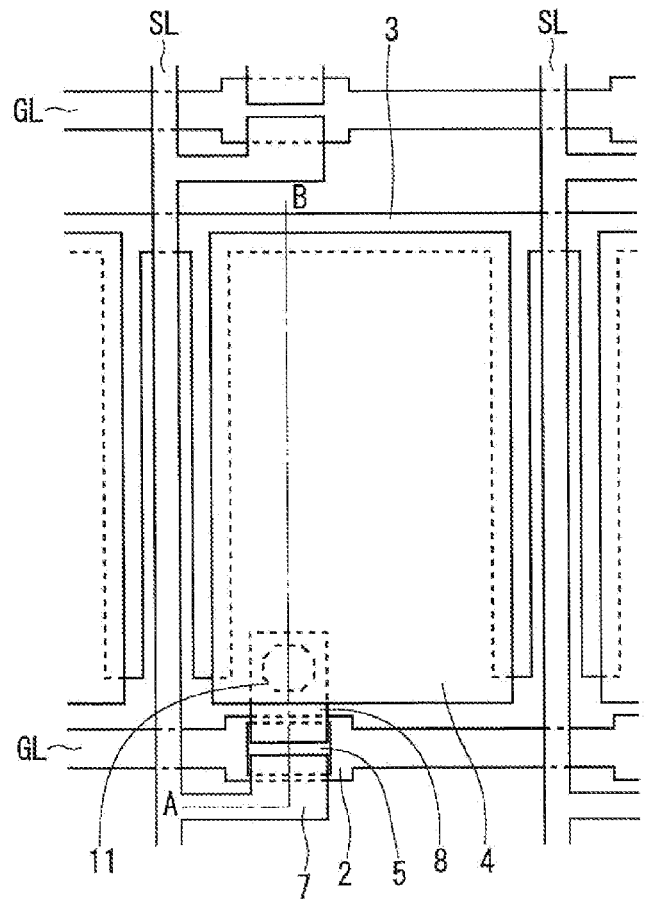
FIG. 6 is a plan view of a structure of a principal portion of a TFT active matrix substrate according to the first preferred embodiment.
Figure 7:
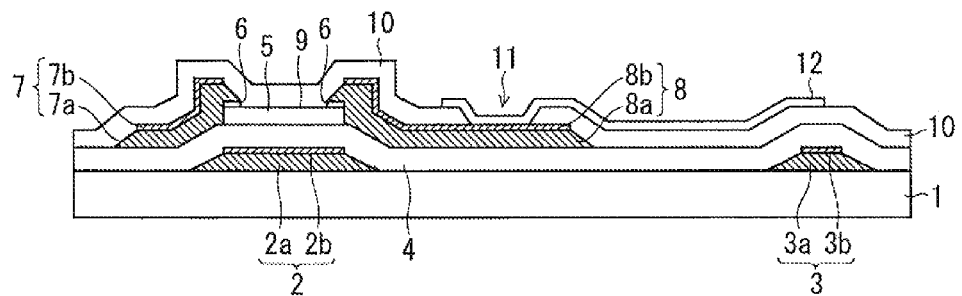
FIG. 7 is a cross sectional view of a structure of a principal portion of the TFT active matrix substrate according to the first preferred embodiment.
Figure 8:
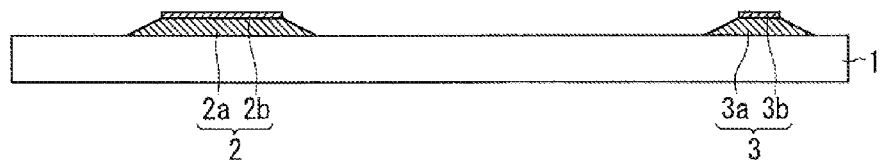

FIG. 6 is a plan view of a structure of a principal portion (one pixel region) of a TFT active matrix substrate according to the first preferred embodiment, and FIG. 7 is a cross sectional view taken along a line A-B. As illustrated in FIG. 7, the TFT active matrix substrate has a transparent insulating substrate 1 provided thereon with a gate electrode 2, a gate insulating film 4, a semiconductor film 5, an ohmic contact film 6, a TFT formed of a source electrode 7 and a drain electrode 8, a pixel electrode 12 which is a transparent conductive film connected to the drain electrode 8 of the TFT, and an auxiliary capacitance electrode 3.

The ohmic contact films 6 interposed between the semiconductor film 5 and the source electrode 7, and between the semiconductor film 5 and the drain electrode 8, respectively, are a low-resistance layer of silicon (Si) added with impurities. A region in the semiconductor film 5 between the source electrode 7 and the drain electrode 8 serves as a channel portion 9 in which a channel of the TFT is formed. An interlayer dielectric film 10 for protecting the channel portion 9 of the TFT is provided on an entire surface on the transparent insulating substrate 1, and the pixel electrode 12 is connected to the drain electrode 8 through a contact hole 11 formed in the interlayer dielectric film 10. In addition, as illustrated in FIG. 6, the source electrode 7 is integrally formed with a source line SL to which the source electrode 7 is connected, and the gate electrode 2 is integrally formed with a gate line GL to which the gate electrode 2 is connected.

In the example illustrated in FIGS. 6 and 7, the Al wiring film 101 illustrated in FIG. 1 is applied to the gate electrode 2, the auxiliary capacitance electrode 3, the source electrode 7, and the drain electrode 8 on the TFT active matrix substrate. This means that the gate electrode 2 has a double-layer structure formed of a first Al alloy layer 2a and a second Al alloy layer 2b, and the auxiliary capacitance electrode 3 has a double-layer structure formed of a first Al alloy layer 3a and a second Al alloy layer 3b. Similarly, the source electrode 7 has a double layer structure formed of a first Al alloy layer 7a and a second Al alloy layer 7b, and the drain electrode 8 has a double layer structure formed of a first Al alloy layer 8a and a second Al alloy layer 8b.

The first Al alloy layers 2a, 3a, 7a, and 8a are individually made of either Al or an Al alloy as in the case of the first Al alloy layer 101a illustrated in FIG. 1. The second Al alloy layers 2b, 3b, 7b, and 8b are individually made of an Al alloy containing at least one element of Ni, Pd, and Pt as in the case of the second Al alloy layer 101b illustrated in FIG. 1.

Hereinafter, a description will be given of a method for manufacturing the TFT active matrix substrate illustrated in FIGS. 6 and 7. FIGS. 8 to 11 are diagrams of a manufacturing process of the TFT active matrix substrate.

First, a transparent insulating substrate 1 such as a glass substrate is cleaned using a cleaning liquid or pure water, and the gate electrode 2 having a tapered shape and the gate line GL to which the gate electrode 2 is connected, and the auxiliary capacitance electrode 3 are formed on the transparent insulating substrate 1 (FIG. 8) using a method described with reference to FIGS. 2 to 4.

Figure 9:
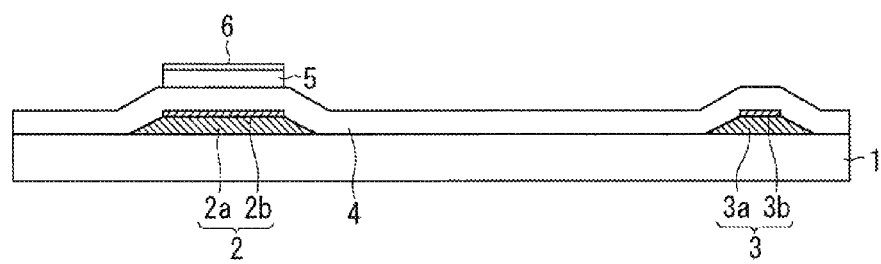

Next, the gate insulating film 4, an Si film serving as the semiconductor film 5, and an n$^+$ type Si film (Si film heavily doped with n-type impurities) serving as the ohmic contact film 6 are sequentially formed, the Si film and the n$^+$ type Si film are subjected to patterning using a photoengraving technique, so that a semiconductor pattern of TFT formed of the semiconductor film 5 and the ohmic contact film 6 is formed on the gate insulating film 4 (FIG. 9). At this stage, the ohmic contact film 6 is not yet separated into a source side and a drain side.

In the process illustrated in FIG. 9 according to this preferred embodiment, first, a silicon nitride (SiN) film with a thickness of 400 nm is formed as the gate insulating film 4 by the chemical vapor deposition (CVD) method under a substrate heating condition of about 300° C. Thereafter, a film of amorphous silicon (a-Si) with a thickness of 150 nm is formed as an Si film serving as the semiconductor film 5, and an a-Si film with a thickness of 50 nm added with phosphor (P) as an impurity is formed as an n$^+$ type Si film serving as the ohmic contact film 6. Then, a positive type photoresist of a novolak resin is coated by a slit coater or a spin coater to a thickness of 1.6 μm and is exposed using a photomask. Subsequently, the resultant is developed using an organic alkaline chemical solution containing TMAH, and a photoresist pattern of the pattern of the semiconductor film 5 is formed. The a-Si film and the n$^+$ type a-Si film are subjected to patterning using the photoresist pattern as a mask by dry etching using a fluorine series gas, and thereby the semiconductor pattern of the TFT formed of the semiconductor film 5 and the ohmic contact film 6 is formed. Further, the photoresist pattern is stripped off and removed using an amine series stripping solution.

Next, the source electrode 7 having a tapered shape, the drain electrode 8, and the source line SL to which the source electrode 7 is connected are formed on the gate insulating film 4, the semiconductor film 5, and the ohmic contact film 6 (FIG. 10) by the method described with reference to FIGS. 2 to 4.

Here, before removing the photoresist pattern used for patterning the source electrode 7 and the drain electrode 8, further using the pattern as a mask, the ohmic contact film 6 is etched by dry etching using a gas containing, for example, chlorine (Cl). Through this process, the ohmic contact film 6 is separated into a source side and a drain side. At this stage, a portion of the semiconductor film 5 in a region from which the ohmic contact film 6 is removed serves as the channel portion 9 of the TFT. The photoresist pattern is removed thereafter.

Next, a silicon nitride (SiNx) film is formed as the interlayer dielectric film 10 at a film forming temperature of 200° C. According to this preferred embodiment, the SiN film with a thickness of 300 nm is formed by the chemical vapor deposition (CVD) method under a substrate heating condition of about 300° C.

Thereafter, a photoresist pattern with a region for forming the contact hole 11 is opened is formed using a photoengraving technique, and, using the photoresist pattern as a mask, the contact hole 11 is formed in the interlayer dielectric film 10 by dry etching using a fluorine series gas.

Finally, a transparent conductive film is formed on the interlayer dielectric film 10 including the contact hole 11, and the resultant is subjected to patterning to form the pixel electrode 12 (FIG. 11). According to this preferred embodiment, IZO (indium oxide ($In_2O_3$)-zinc oxide (ZnO)) is formed into a film with a thickness of 100 nm as the transparent conductive film by sputtering using an Ar gas. A photoresist pattern is formed thereon by a photoengraving technique, and, using the photoresist pattern as a mask, wet etching is performed using a oxalic acid series solution to form the pixel electrode 12.

By the foregoing process, the TFT active matrix substrate having a structure illustrated in FIGS. 6 and 7 is completed.

Although it is not illustrated, an alignment film made of polyimide or the like for aligning the liquid crystal, and a spacer for securing a gap from an opposing substrate provided thereon with color filters or the like are formed on a surface of the completed TFT active matrix substrate. Then, the TFT active matrix substrate is bonded to the opposing substrate, the liquid crystal is injected between the two substrates, and the two substrates are sealed together to thereby form a liquid crystal display panel. Then, a polarizing plate, a phase plate, a backlight unit, and the like are arranged outside the liquid crystal display panel to complete the liquid crystal display apparatus.

As in the case of this preferred embodiment, the Al wiring film 101 illustrated in FIG. 1 is applied to the gate electrode 2, the auxiliary capacitance electrode 3, the source electrode 7, and the drain electrode 8 on the TFT active matrix substrate. As a result of this, the step coverage characteristic of the gate insulating film 4 and the interlayer dielectric film 10 is improved, and the occurrence of a reduction in the breakdown voltage or a broken wire in the TFT active matrix substrate can be suppressed.

In this preferred embodiment, although the Al wiring film 101 illustrated in FIG. 1 is applied both to the wiring layer for the gate electrode 2 and the auxiliary capacitance electrode 3, and the wiring layer for the source electrode 7 and the drain electrode 8, it is also possible to apply the Al wiring film 101 to one of these.

In particular, when the Al wiring film 101 illustrated in FIG. 1 is applied to the source electrode 7 and the drain electrode 8, it is preferable to use, as the first Al alloy layer 7a, an Al alloy film to which a rare earth metal such as neodymium (Nd), lanthanum (La), or gadolinium (Gd) is added so that an excellent contact characteristic is obtained in an interface with the ohmic contact film 6 which makes contact with lower surfaces of the source electrode 7 and the drain electrode 8.

Further, the pixel electrode 12 is connected to the second Al alloy layer 7b of the source electrode 7. The Al alloy film of the second Al alloy layer 7b contains the additive element of Ni, Pd, or Pt. When the interlayer dielectric film 10 and the like are formed at a high temperature, the additive element agglomerates and is deposited in an surface layer. This also provides an effect of improving a contact characteristic with a conductive oxide film such as IZO or ITO used for the pixel electrode 12.

Second Preferred Embodiment

FIG. 12 is a cross sectional view of a structure of an Al wiring film according to a second preferred embodiment. As illustrated in FIG. 12, an Al wiring film 201 formed on a substrate 100 according to this preferred embodiment has a triple-layer structure including a first Al alloy layer 201a, a second Al alloy layer 201b, and a third Al alloy layer 201c which are laminated in this order, and has a tapered shape in cross section with a width smaller in an upper portion thereof than a width in a bottom portion thereof.

The first Al alloy layer 201a is made of an Al alloy containing at least one element of Ni, Pd, and Pt. The second Al alloy layer 201b is made of an Al alloy containing nitrogen (N). The third Al alloy layer 201c is made of an Al alloy containing at least one element of Ni, Pd, and Pt. The first Al alloy layer 201a and the third Al alloy layer 201c may have an identical composition. Also, the second Al alloy layer 201b may be formed by adding nitrogen to an Al alloy which is the same as that used for the first Al alloy layer 201a or the third Al alloy layer 201c.

The substrate 100 serving as a base for the Al wiring film 201 may be a semiconductor substrate such as a silicon substrate, an insulating substrate such as a glass substrate used for the active matrix substrate, or an interlayer dielectric film provided on another wiring layer.

Figure 13:
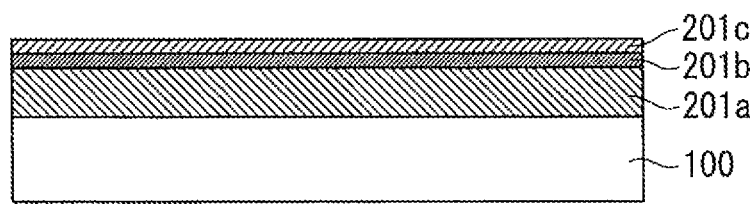
FIGS. 13 to 15 are manufacturing process diagrams of the Al wiring film according to the second preferred embodiment.
Figure 14:
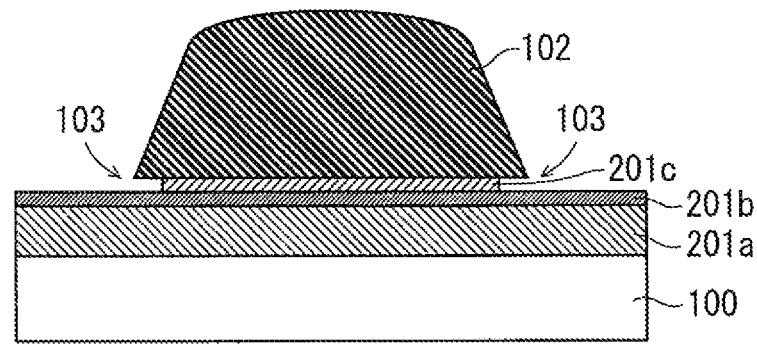
Figure 15:
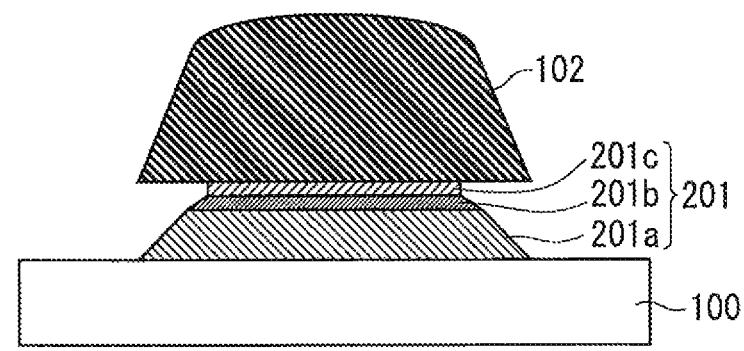

Hereinafter, a method for manufacturing the Al wiring film 201 illustrated in FIG. 12 will be described. FIGS. 13 to 15 are manufacturing process diagrams thereof.

First, a triple-layer structure is formed on the substrate 100 by sequentially forming, by sputtering using the Ar gas, the first Al alloy layer 201a made of the Al alloy containing at least one element of Ni, Pd, and Pt, the second Al alloy layer 201b resulted from azotizing an Al alloy film, and the third Al ally layer 201c made of the Al alloy containing at least one element of Ni, Pd, and Pt (FIG. 13).

In this preferred embodiment, in view of simplifying the manufacturing process, the first Al alloy layer 201a and the third Al alloy layer 201c use an Al alloy having an identical composition, and the second Al alloy layer 201b uses an Al alloy resulted from azotizing the same Al alloy. In this case, the first Al alloy layer 201a, the second Al alloy layer 201b, and the third Al alloy layer 201c can be formed by the sputtering method using a consistent identical target in the above-mentioned sputtering process. With this arrangement, when the second Al alloy layer 201b is formed, merely a process of mixing the Ar gas with a nitrogen gas and performing the reactive sputtering is performed. Accordingly, a reduction in the manufacturing cost and an improvement in the productivity can be expected.

It is preferable that the additive amounts of Ni, Pd, and Pt in the first Al alloy layer 201a, the second Al alloy layer 201b, and the third Al alloy layer 201c, individually, be 0.5 mol % or more and 10 mol % or less (more preferably, 1 mol % or more and 10 mol % or less) as in the case of the second Al alloy layer 101b in the first preferred embodiment.

The second Al alloy layer 201b is a layer having a low etching rate with respect to the organic alkaline developing solution. The etching rate of the Al alloy with respect to the alkaline developing solution is reduced by adding atoms of nitrogen (N). It is preferable that the additive amount of atoms of nitrogen (N) to the second Al alloy layer 201b be 10 mol % or more so that the etching rate of the second Al alloy layer 201b is sufficiently reduced (⅕ or less of the etching rate of the first Al alloy layer 201a and the third Al alloy layer 201c).

However, if the additive amount of the atoms of N is excessively increased, the conductivity of the second Al layer 201b is impaired, it is preferable to limit the additive amount to such an amount by which the conductivity of the second Al alloy layer 201b is maintained. Considering Ti, Cr, Mo, Ta, W, and alloys thereof which are generally used for the wiring film of a semiconductor device as a reference, and assuming that an upper limit of a specific resistance value of the second Al alloy layer 201b is 200 μΩcm, it is preferably that the additive amount of the atoms of N be 40 mol % or less.

After the triple-layer structure formed of the first Al alloy layer 201a, the second Al alloy layer 201b, and the third Al alloy layer 201c is formed, a photoresist 102 having a predetermined pattern is formed on the third Al alloy layer 201c using a photoengraving technique (FIG. 14). In this preferred embodiment, the photoresist 102 is formed by coating and exposing a positive type photoresist of a novolak resin, and by developing using a TMAH organic alkaline chemical solution.

Here, since the Al alloy containing at least one element of Ni, Pd, and Pt can be etched by the TMAH organic alkaline chemical solution, the third Al alloy layer 201c exposed from the photoresist 102 is etched by extending the time of the developing process of the photoresist 102. As a result, the third Al alloy layer 201c under the photoresist 102 is etched in a transverse direction (in-plane direction of the film), and a width thereof becomes smaller than that of the photoresist 102. This means that ends of the third Al alloy layer 201c individually recede from ends of the photoresist 102.

In contrast, the second Al alloy layer 201b which is an azotized Al alloy is highly resistant to the TMAH organic alkaline chemical solution, and therefore is hardly etched.

Accordingly, as illustrated in FIG. 14, notches 103 having an undercut shape are formed between the photoresist 102 and the second Al alloy layer 201b, the under cut shape being caused by receding of the ends of the third Al alloy layer 201c.

Thereafter, in wet etching using the photoresist 102 as a mask, the first Al alloy layer 201a, the second Al alloy layer 201b, and the third Al alloy layer 201c are simultaneously subjected to etching and patterning, so that the Al wiring film 201 having the predetermine pattern is formed (FIG. 15). In this preferred embodiment, an etchant of PAN series (phosphoric acid, acetic acid, and nitric acid series) is used for the wet etching.

During this process, since a notch shape is provided under the photoresist 102, the ends of the third Al alloy layer 201c and upper surfaces of the second Al alloy layer 201b and the first Al alloy layer 201a are isotropically etched. Specifically, the upper surfaces of the second Al alloy layer 201b and the first Al alloy layer 201a are etched while the ends of the third Al alloy layer 201c further recede. As a result, the sidewall of the Al wiring film 201 is inclined, and the Al wiring film 201 has a tapered shape with a width smaller in the upper portion than a width in the bottom portion.

Finally, by removing the photoresist 102, the Al wiring film 201 illustrated in FIG. 12 is completed.

Since the Al wiring film 201 according to this preferred embodiment has a tapered shape, it is possible to have a good step coverage characteristic when an insulating film is formed thereon. Accordingly, this prevents the breakdown voltage of the insulating film from reducing, prevents the wire of the wiring film in the upper layer from breaking, and contributes to improvement of the yield of the product.

Further, since a process of patterning the Al wiring film 201 into a tapered shape can be performed during the isotropically etching of the first Al alloy layer 201a, the second Al alloy layer 201b, and the third Al alloy layer 201c, the tapered shape (inclination of the sidewall) of the Al wiring film 201 is hardly affected by the change of the composition of the etchant. Therefore, the Al wiring film 201 having a predetermined tapered shape can be obtained easily and in a stable manner without a need to manage the etchant stricter than in the conventional case. Accordingly, an increase in the cost incurred in managing the etchant can be suppressed.

In this preferred embodiment, in order to smooth the Al wiring film 201, it is preferable to set a film thickness of the third Al alloy layer 201c to ⅕ or less of a sum of film thicknesses of the first Al alloy layer 201a and the third Al alloy layer 201c. With this arrangement, it is possible to optimize the notch shape of the photoresist 102 after the developing process and the tapered shape of the Al wiring film 201 after patterning.

As in the case of the Al wiring film 101 in the first preferred embodiment, the Al wiring film 201 having the triple-layer structure according to the second preferred embodiment can be applied to the gate electrode 2, the auxiliary capacitance electrode 3, the source electrode 7, and the drain electrode 8 of the TFT active matrix substrate illustrated in FIGS. 6 and 7.

It is also possible to use a combination of the Al wiring film 101 of the first preferred embodiment and the Al wiring film 201 of the second preferred embodiment. For example, FIG. 16 illustrates a structure of a TFT active matrix substrate in which the Al wiring film 101 of the first preferred embodiment is applied to the wiring layer of the gate electrode 2 and the auxiliary capacitance electrode 3, and the Al wiring film 201 of the second preferred embodiment is applied to the wiring layer of the source electrode 7 and the drain electrode 8.

Referring to FIG. 16, the gate electrode 2 and the auxiliary capacitance electrode 3 have a double-layer structure including a first layer (first Al alloy layers 2a and 3a) made of Al or an Al alloy, and a second layer (second Al alloy layers 2b and 3b) made of an Al alloy containing at least one element of Ni, Pd, and Pt. In contrast, the source electrode 7 and the drain electrode 8 have a triple-layer structure including a first layer (first Al alloy layers 71a and 81a) made of an Al alloy containing at least one element of Ni, Pd, and Pt, and a second layer (second Al alloy layers 71b and 81b) made of an Al alloy containing nitrogen, and a third layer (third Al alloy layers 71c and 81c) made of an Al alloy containing at least one element of Ni, Pd, and Pt.

In particular, when the Al wiring film 201 of the second preferred embodiment is applied to the source electrode 7 and the drain electrode 8, the first Al alloy layers 71a and 81a which are the bottom layer and the third Al alloy layers 71c and 81c which are the upper layer are made of an Al alloy added with transition elements of group 10 of Ni, Pd, or Pt. Therefore, it is possible to obtain an excellent contact characteristic in an interface with the ohmic contact film 6 which makes contact with lower surfaces of the source electrode 7 and the drain electrode 8, and further in an interface with the pixel electrode 12 (conductive oxide film such as IZO or ITO) which is connected to an upper surface of the drain electrode 8.

The a-Si film is used as an example of the semiconductor film 5 of the TFT active matrix substrate described above. It is also possible to use a semiconductor of a zinc oxide (ZnO) base, or a semiconductor of an oxide base including zinc oxide (ZnO) to which gallium oxide ($Ga_2O_3$), indium oxide ($In_2O_3$), tin oxide ($SnO_2$), or the like is added. When such a semiconductor film of the oxide base is used as the semiconductor film 5, it is possible to obtain a TFT having higher performance where the carrier mobility is high than in the case of using the a-Si film.

In particular, when the Al wiring film 201 of the second preferred embodiment is applied to the source electrode 7 and the drain electrode 8, an excellent contact characteristic is achieved in an interface between the first Al alloy layer 201a which is an Al alloy added with Ni, Pd, or Pt and the semiconductor film 5 of the oxide base. This makes it possible to obtain a TFT having higher performance.

While the invention has been shown and described in detail, the foregoing description is in all aspects illustrative and not restrictive. It is therefore understood that numerous modifications and variations can be devised without departing from the scope of the invention.

What is claimed is:

1. A wiring film comprising:
   a first layer made of a first Al alloy containing at least one element of Ni, Pd, and Pt;
   a second layer laid on said first layer and made of a second Al alloy containing nitrogen; and
   a third layer laid on said second layer and made of a third Al alloy containing at least one element of Ni, Pd, and Pt, wherein
   the wiring film has a tapered shape in cross section with a width smaller in an upper portion thereof than a width in a bottom portion thereof.

2. The wiring film according to claim 1,
   wherein said first Al alloy and said third Al alloy have an identical composition.

3. The wiring film according to claim 1,
said first, second, and third Al alloys individually contain 0.5 mol % or more and 10 mol % or less of at least one element of Ni, Pd, and Pt.

4. An active matrix substrate comprising:
a pixel electrode formed of a conductive film of an oxide material; and
a switching element connected to said pixel electrode,
wherein said switching element is a thin-film transistor including the wiring film according to claim 1 as an electrode thereof, and
said third layer of said wiring film serving as said electrode is connected to said pixel electrode.

\* \* \* \* \*